United States Patent [19]

Killinger

[11] Patent Number: 5,301,200
[45] Date of Patent: Apr. 5, 1994

[54] ELECTRONIC SYSTEM FOR AN INDICATOR DEVICE HAVING A MATRIX COMPOSED OF BISTABLE MATRIX POINTS

[75] Inventor: Erich Killinger, Gaggenau, Fed. Rep. of Germany

[73] Assignee: Dambach-Werke GmbH, Fed. Rep. of Germany

[21] Appl. No.: 738,507

[22] Filed: Aug. 1, 1991

[30] Foreign Application Priority Data

Aug. 2, 1990 [DE] Fed. Rep. of Germany ....... 4024499

[51] Int. Cl.$^5$ .............................................. G06F 7/02
[52] U.S. Cl. .................................................. 371/67.1
[58] Field of Search ............ 371/67.1; 364/101, 237.4; 315/158 S

[56] References Cited

U.S. PATENT DOCUMENTS

| | | | |
|---|---|---|---|
| 4,069,480 | 1/1978 | Helwig | 340/373 |
| 4,263,647 | 4/1981 | Merrell et al. | 364/101 |
| 4,675,575 | 6/1987 | Smith et al. | 315/185 S |

FOREIGN PATENT DOCUMENTS 0167445 1/1986 European Pat. Off. .

OTHER PUBLICATIONS

Patent Abstracts of Japan, vol. 12, No. 463 (P-796) Dec. 6, 1988.
Patent Abstracts of Japan, vol. 13, No. 57 (P-825) Feb. 9, 1989.
B. Karpf. "Bistabile elektromagnetische Grossanzeigen." Der Elektroniker [Electronic Technician]. Jul. 1984: pp. 62–65.
"Parallel und seriell ansteuerbar." eee. Nov. 1986. No. 23: Vom. 18: pp. 32 and 34.

Primary Examiner—Robert W. Beausoliel, Jr.
Assistant Examiner—Phung M. Chung
Attorney, Agent, or Firm—Speckman, Pauley & Fejer

[57] ABSTRACT

An electronic system for checking a matrix composed of bistable matrix points comprising an electromagnet, one lead of which is connected to a corresponding column line and the other lead of which is connected, depending on the direction of current flow, through oppositely polarized diodes to a corresponding row setting line and a corresponding row resetting line. The column lines, the row setting lines and the row resetting lines of the matrix are activated during setting and resetting by a processor, a column decoder and a row decoder such that the column lines are activated in a column cycle in sequence with a setting counter-potential or a resetting counter-potential, and where during the course of every individual column activation, all row setting lines or row resetting lines are activated sequentially with a setting potential or a resetting potential. It is possible, by using optical couplers at the columns lines, the row setting and the row resetting lines, to derive comparative information with the aid of a code converter controlled by these optical couplers, which information is compared in the processor to the actual setting or resetting information and which is used to generate an error signal.

12 Claims, 2 Drawing Sheets

ELECTRONIC SYSTEM FOR AN INDICATOR DEVICE HAVING A MATRIX COMPOSED OF BISTABLE MATRIX POINTS

BACKGROUND OF THE INVENTION

1. Field of the Invention

This invention relates to an electronic system for an indicator device having a matrix comprising n rows and m columns of bistable matrix points each having an electromagnet with one lead connected to a corresponding column line and the other lead connected, depending on the direction of current flow, through oppositely polarized diodes to a corresponding row setting line and a corresponding row resetting line. The column lines, the row setting lines and the row resetting lines of the matrix are activated during setting and resetting by a processor, a column decoder and a row decoder. The column lines are activated cyclically in sequence with a setting counter-potential or a resetting counter-potential. In the course of every individual column activation, all row setting lines are activated cyclically in sequence with a setting potential or all row resetting lines with a resetting potential.

2. Description of the Prior Art

An electronic system of this type is disclosed by B. Karpf "Bistabile elektromagnetische Grossanzeigen" (Large Bistable Electromagnetic Indicator Devises), in Der Elektroniker (Electronic Technician), 7/84, pages 62 to 65. This known electronic system is only used for setting and resetting the matrix points. Monitoring of the individual matrix points is not provided by this known circuit.

A matrix activation system is shown on pages 32 and 34 of the magazine eee, No. 23 of Nov. 18, 1986, in which the activation signals are transmitted through optical couplers to the lines of rows of the matrix. This known matrix activation system also provides no monitoring of the matrix points.

SUMMARY OF THE INVENTION

It is an object of this invention to provide an electronic system of the type mentioned above, by which monitoring of the matrix regarding errors is performed when setting and resetting the matrix points.

This object is attained in accordance with one embodiment of this invention wherein a first optical coupler light-emitting diode, connected to a setting potential, is connected to each column line, and emits a first output signal when the setting counter-potential is applied, a second optical coupler light-emitting diode, connected to a resetting potential, is connected to each column line, and emits a second output signal when a resetting counter-potential is applied, a third optical coupler light-emitting diode, connected to a setting counter-potential, is connected to each row setting line, and emits a third output signal when a setting potential is applied, and a fourth optical coupler light-emitting diode, connected to a resetting counter-potential, is connected to each row resetting line, and emits a fourth output signal when a resetting potential is applied. The optical coupler light-emitting diodes send output signals to a code converter using corresponding photodetectors, which provides comparison information to the processor. The processor checks this comparison information for agreement with the setting or resetting information provided to the column decoder and the row decoder and issues an error signal if there is less than full agreement.

It is possible, with the aid of the potentials applied to the row lines, the row setting lines and the row resetting lines and connected optical couplers, to check a portion of the matrix during each setting and resetting operation. Only a single optical coupler should react during setting as well as resetting. This is monitored by an additional code converter, which transmits a corresponding piece of information to the processor only when the output information of the optical couplers is correct. In this regard, the code converter may forward binary information, for example, in order to reduce the number of information lines. It is possible for the processor to compare the information supplied by the code converter in a simple manner, for example, by a table, with the setting or resetting information which it emits at that time to the column decoder and the row decoder. The part of the matrix involved in each setting and resetting operation is checked in this way.

In accordance with one embodiment of this invention, short circuits and interruptions of a matrix point are detected by the monitoring of a current range which can be preset using current monitoring circuits. The current range which can be preset in this case is predetermined by the minimum and maximum current of the matrix point. The current monitoring circuits are looped in the row decoder in the lines for the setting and resetting potential.

In connection with the error display, in accordance with another embodiment of this invention, the error signal also appears when the current monitoring circuits detect that the current range which can be preset has been exceeded in either direction.

In a preferred embodiment of this invention, the setting and resetting of a matrix point occurs in such a way that the activation of the column lines with the setting counter-potential or the resetting counter-potential and the activation of the row setting lines with a setting potential, or of the row resetting lines with a resetting potential, occurs synchronously and pulsed.

In accordance with another embodiment of this invention, the current range of a matrix point is monitored by routing the setting and the resetting circuit over a common current monitoring circuit provided in the power supply line portion.

In accordance with yet another embodiment of this invention, it is possible to reduce the resetting operation whereby during resetting one column line, a plurality of row resetting lines is simultaneously activated and a current monitoring circuit is looped in each row resetting line.

The matrix can also be designed so that the columns and rows are interchangeable.

The invention will be described in detail by means of an exemplary embodiment shown in the drawings.

DESCRIPTION OF PREFERRED EMBODIMENTS

Figure 1:
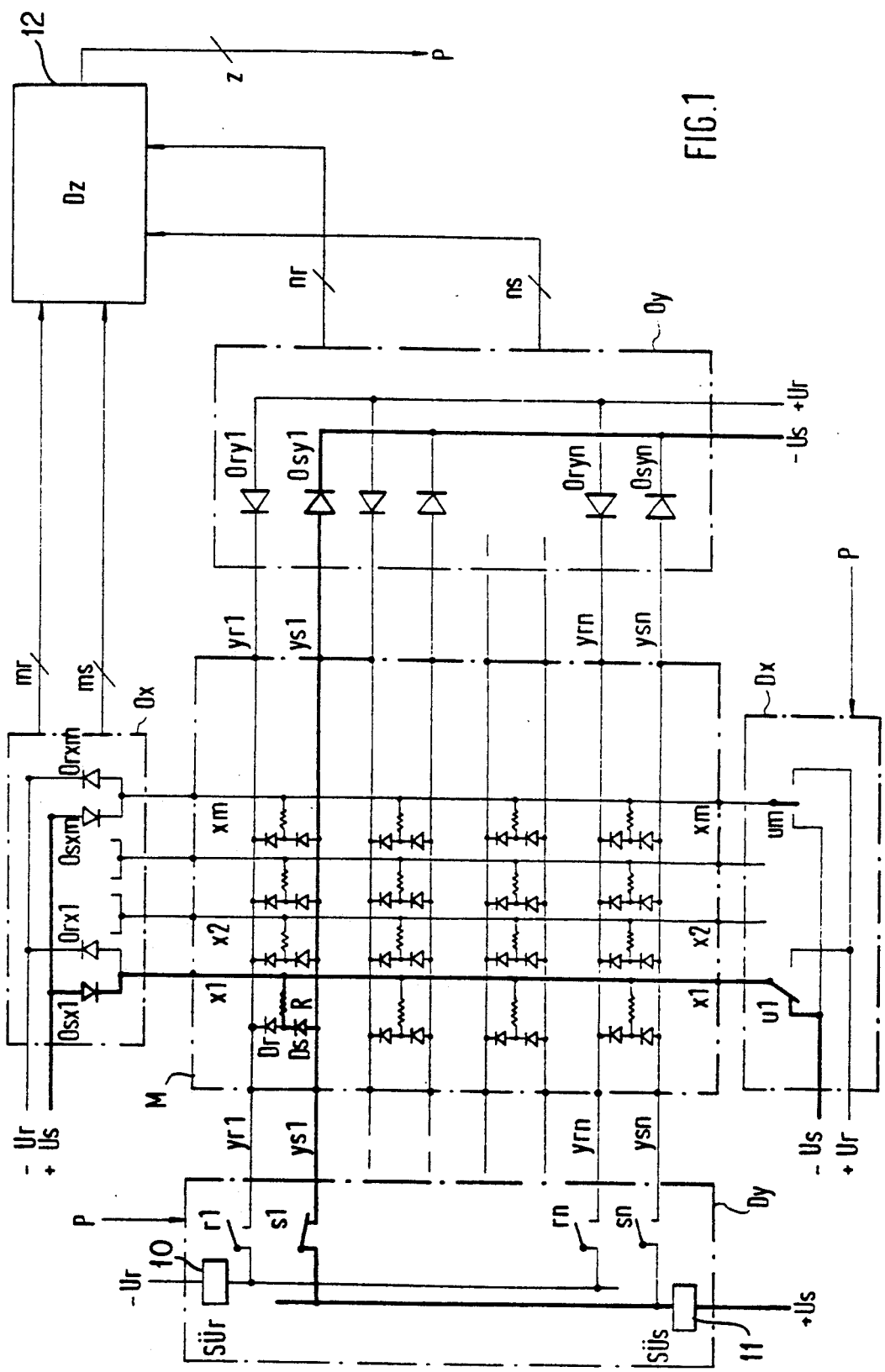
FIG. 1 is a schematic diagram of a matrix with matrix points and test circuits for detecting errors in the matrix, where the matrix point of column 1 and row 1 has been set, in accordance with one embodiment of this invention.

The structure of a matrix M, in accordance with one embodiment of this invention, is made up of m columns and n rows. The matrix points, comprising an electromagnet R and two diodes Ds and Dr, are connected to the crossing points of column lines xl to xm and row lines ysl to ysn or yrl to yrn. As shown in FIG. 1, one lead of the electromagnet R is connected to a corresponding column line xl to xm, while the other lead is connected through one diode Ds to a corresponding row setting line ysl to ysn and through the other diode Dr to the corresponding row resetting line yrl to yrn. In the course of setting, one column after the other is charged with a setting counter-potential $-Us$. In the course of each pulse-shaped column activation, the row setting lines ysl to ysn are charged one after the other synchronously and pulsed with a setting potential $+Us$. The setting information is provided by a processor P, not shown, to a column decoder Dx and a row decoder Dy. As indicated by switches sl and ul, only the heavily drawn circuit is effected by the control operation shown in FIG. 1. Schematically indicated contacts sl to sn, rl to rn and ul to un forward the addressing.

So that the matrix can be checked with each setting operation, an optical coupler light-emitting diode Osxl to Osxm, which reacts to the setting counter-potential $-Us$, is connected to each column line xl to xm. Optical coupler light-emitting diodes Osyl to Osyn, which react to the setting potential, are connected to row setting lines ysl to ysn. The optical coupler light-emitting diodes Osxl to Osxm of the column lines xl to xm are connected to the setting potential $+Us$, and the optical coupler light-emitting diodes Osyl to Osyn of the row setting lines ysl to ysn are connected to the setting counter-potential $-Us$.

When the electromagnet, indicated by R, is activated, which activation occurs through the addressing of the column decoder Dx and the row decoder Dy on the column line xl with setting counter-potential $-US$ and through the row setting line ysl, only the optical coupler light-emitting diodes Osxl and Osyl react, provided the matrix does not contain an error. The output signals of these two optical coupler light-emitting diodes are provided by photodetectors of these optical couplers, not shown, to a code converter Dz12. These output signals are converted into binary information by the code converter Dz12, which reaches a processor P through a reduced number z of information lines. This information is compared in a simple manner to the actual setting information in the processor P. If there is agreement, no error exists in the matrix M and no error signal is issued.

Figure 2:
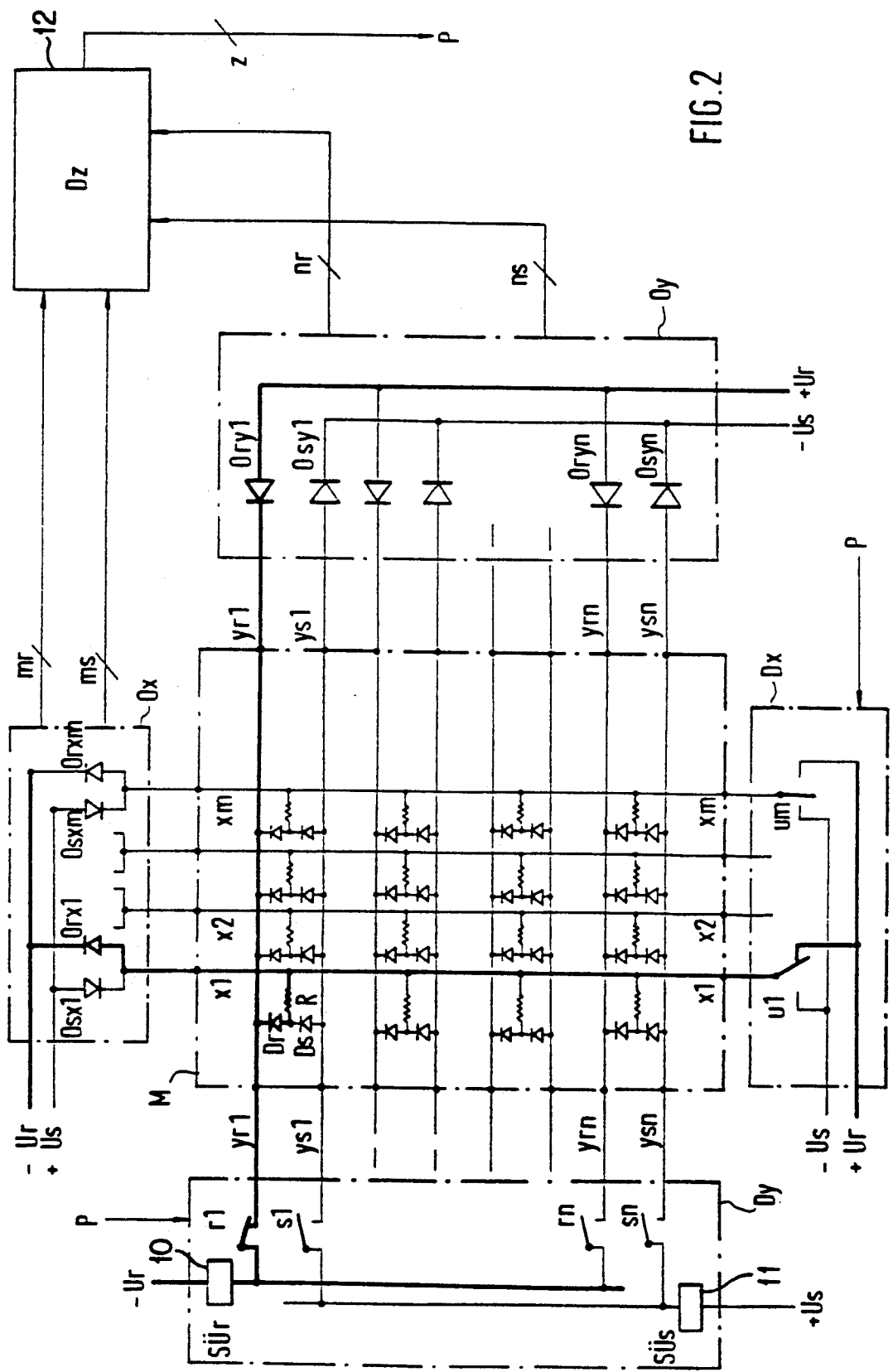
FIG. 2 is a schematic diagram of the matrix structure shown in FIG. 1 where the matrix point of column 1 and row 1 is just being reset.

During the course of the continuing control cycle, the remaining row setting lines up to ysn are successively activated, and the column line xl is pulse-activated each time along with them. The same process is repeated in connection with column line x2 and again all row setting lines ysl to ysn, until finally, at the end of the control cycle, the column line xm is activated in the sub-cycle, together with the row setting lines ysl to ysn. In this manner all matrix points are successively activated and set, provided that in addition to the activated column lines xl to xm the activated row setting lines ysl to ysn also receive the correct potential. Contacts sl are selected by the processor P in accordance with the matrix points to be set and are activated through the line decoder Dy. Thus, in the course of an activation cycle of a matrix point, which is not intended to be set, no optical coupler should react, while in connection with a matrix point to be set, the optical coupler light-emitting diodes Osxl and Osy 1, connected with the associated column line, for example xl, and the associated row setting line, for example ysl, must react. In this way, a check of the activated matrix points, and thus of the matrix M, too, occurs with each activation cycle. The optical coupler light-emitting diodes Osxl to Osxm, associated with the column lines xl to xm, are combined into a component Ox, together with the optical coupler light-emitting diodes Orxl to Orxm, also associated with the column lines and required for checking the matrix M in the course of the resetting operation. These optical coupler light-emitting diodes Orxl to Orxm are connected to the resetting potential $-Ur$ and react when the resetting counter-potential $+Ur$ is connected to the column lines xl to xm. As shown in FIG. 2, this occurs in the column decoder Dx through schematically indicated addressing contacts ul to um, which are controlled by the processor P.

Additionally, the optical coupler light-emitting diodes Oryl to Oryn are connected to the line resetting lines yrl to yrn and to the resetting counter-potential $+Ur$ and react when the resetting potential $-Ur$ is present in the associated row resetting line yrl to yrn.

During resetting, the electromagnet R receives its current through the diode Dr, while current flows through the diode Ds during setting of the electromagnet R. This setting and resetting is accomplished by current reversal. While during setting in the row decoder, actuation of the row setting lines ysl to ysn in accordance with the desired setting depends on the position of the contacts sl to sn, the column lines xl to xm are charged with the setting counter-potential $-Us$ in each activation cycle. On the other hand, during resetting, all row resetting lines yrl to yrn are charged with the resetting potential $-Ur$ during the associated activation cycles, while the column lines xl to xm are provided with the resetting counter-potential $+Ur$ in the activation cycles. The matrix points and with them, the matrix M, are also checked for errors during the actuation cycle of resetting.

The optical coupler light-emitting diodes Osyl to Osyn and Oryl to Oryn, associated with the row setting lines ysl to ysn and the row resetting lines yrl to yrn, together with the associated photodetectors, are combined in a unit Oy. The unit Ox has m setting lines ms and m resetting lines mr, while the unit Oy has n setting outputs ns and n resetting outputs nr, corresponding to the number n of lines. Checking within an activation cycle is very simple, because none of these outputs may emit a signal in the activation pause. During a setting cycle, only a single setting output ms and a single setting output ns may emit an output signal, while during a resetting cycle only a single resetting output mr and a single resetting output nr may emit an output signal. Additionally, these two output signals must appear simultaneously during the setting cycle and the resetting cycle. If an output signal is missing, there is an error in the activated matrix point.

To extend checking even further, the current in the row decoder Dy is measured during setting as well as during resetting. This current is monitored by current monitoring circuits SÜs 11 and SÜr 10. It may lie within a preset range which is determined, for example, by the minimum and maximum currents of a matrix point. An error signal is issued if the current monitoring circuits SÜs 11 and SÜr 10 register that this current range has been exceeded on either end during the setting cycle or resetting cycle, because in this case there is also an error in the matrix.

The comparison information corresponding to the setting or resetting information is derived during each setting cycle and each resetting cycle through the code converter Dz12, so that it is possible to determine its agreement or non-agreement in the processor P. In case of non-agreement, an error signal may be issued immediately or after a number of determinations of non-agreement.

Current monitoring can also be performed in a different way. A common, central current monitoring circuit for the setting and the resetting operation is provided, which in this case is housed in the central power supply portion of the electronic system.

Resetting can also be performed where a column line, for example xl, is actuated together with a plurality of row resetting lines yrl to yrn. In this case actuation is also performed in pulses and cyclically. But all matrix points connected to the activated row resetting lines yrl to yrn and leading to the activated column line xl are reset. Separate current monitoring circuits are then assigned for current monitoring to all simultaneously activated row resetting lines. These current monitoring lines can also be multiply used, if the matrix, divided into a plurality of such blocks of rows, is included in the actuation process of the processor.

I claim:

1. In an electronic system for an indicator device having a matrix (M) comprising n rows and m columns of bistable matrix points, each having an electromagnet (R), with a first lead connected to a corresponding column line (xl ... xm) and a second lead connected, depending on a direction of current flow, through a plurality of oppositely polarized diodes (Ds, Dr) to a corresponding row setting line (ysl ... ysn) and a corresponding row resetting line (yrl ... yrn), in which the column lines (xl ... xm), the row setting lines (ysl ... ysn) and the row resetting lines (yrl ... yrn) of the matrix (M) are activated during setting and resetting by a processor (P), a column decoder (Dx) and a row decoder (Dy) such that the column lines (xl ... xm) are activated cyclically in sequence with one of a setting counter-potential (−Us) and a resetting counter-potential (+Ur), and wherein during the course of every individual column activation, all row setting lines (ysl ... ysn) are activated cyclically in sequence with one of a setting potential (+Us) and all row resetting lines (yrl ... yrn) with a resetting potential (−ur), the improvement comprising:

a first optical coupler light-emitting diode (Osxl ... Osxm), connected to the setting potential (+Us) and to each column line (xl ... xm), and emitting a first output signal (to ms) when the setting counter-potential (−Us) is applied, a second optical coupler light-emitting diode (Orxl ... Orxm), connected to the resetting potential (−Ur) and to each column line (xl ... xm), and emitting a second output signal (to mr) when a resetting counter-potential (+Ur) is applied, a third optical coupler light-emitting diode (Osyl ... Osyn), connected to the setting counter-potential (−Us) and to each row setting line (ysl ... ysn), and emitting a third output signal (to ns) when a setting potential (+Us) is applied, a fourth optical coupler light-emitting diode (Oryl ... Oryn), connected to the resetting counter-potential (+Ur) and to each row resetting line (yrl ... yrn), and emitting a fourth output signal (to nr) when a resetting potential (−Ur) is applied, a corresponding photodetector in communication with said optical coupler light-emitting diodes, said optical coupler light-emitting diodes (Osxl ... Osxm; Orxl ... Orxm; Osyl ... Osyn; Oryl ... Oryn) sending said output signals (ms, mr, ns, nr) to a code converter (Dz) through said corresponding photodetector, which sends out comparison information to a processor (P), and said processor (P) checking said comparison information for agreement with one of setting and resetting information sent to the column decoder (Dx) and the row decoder (Dy) and generating an error signal if there is less than full agreement.

2. In an electronic system in accordance with claim 1, wherein a plurality of current monitoring circuits (SÜs, SÜr) monitors a range of currents, which is preset, during said setting and said resetting.

3. In an electronic system in accordance with claim 2, wherein the current range of the minimum and maximum current flowing through each of said bistable matrix points is preset.

4. In an electronic system in accordance with claim 3, wherein the current monitoring circuits (SÜs, SÜr) are looped in at least one line to one of the setting and resetting potential (+Us and −Ur) in the row decoder (Dy).

5. In an electronic system in accordance with claim 4, wherein a column activation of the column lines (xl ... xm) with one of the setting counter-potential (−Us) and the resetting counter-potential (+Ur) and a row activation of one of the row setting lines (ysl ... ysn) with a setting potential (+Us) and the row resetting lines (yrl ... yrn) with a resetting potential (−Ur) occurs synchronously and pulsed.

6. In an electronic system in accordance with claim 2, wherein the current monitoring circuits (SÜs, SÜr) are looped in at least one line to one of the setting and resetting potential (+Us and −Ur) in the row decoder (Dy).

7. In an electronic system in accordance with claim 2, wherein the error signal is generated when the current monitoring circuits (SÜs, SÜr) detect that at least one of said setting and said resetting is outside of the current range.

8. In an electronic system in accordance with claim 1, wherein a column activation of the column lines (xl ... xm) with one of the setting counter-potential (−Us) and the resetting counter-potential (+Ur) and a row activation of one of the row setting lines (ysl ... ysn) with a setting potential (+Us) and the row resetting lines (yrl ... yrn) with a resetting potential (−Ur) occurs synchronously and pulsed.

9. In an electronic system in accordance with claim 1 further comprising a common current monitoring circuit located in a power supply line, a setting circuit and a resetting circuit, said setting circuit and said resetting circuit routed through said common current monitoring circuit.

10. In an electronic system in accordance with claim 1,
  wherein
  during the course of resetting one of said column lines (xl ... xm), simultaneously a plurality of row resetting lines (yrl ... yrn) are activated, and
  a current monitoring circuit is looped into each of said row resetting lines (yrl ... yrn).

11. In an electronic system in accordance with claim 1,
  wherein
  the columns and the rows of the matrix (M) are interchanged.

12. In an electronic system in accordance with claim 11,
  wherein
  the error signal is generated when the current monitoring circuits (SÜs, SÜr) detect that at least one of said setting and said resetting is outside of the current range.

* * * * *